United States Patent [19]
Okonogi

[11] Patent Number: 5,970,366
[45] Date of Patent: Oct. 19, 1999

[54] METHOD OF REMOVING METALLIC CONTAMINANTS FROM SIMOX SUBSTRATE

[75] Inventor: Kensuke Okonogi, Tokyo, Japan

[73] Assignee: NEC Corporation, Tokyo, Japan

[21] Appl. No.: 08/895,034

[22] Filed: Jul. 16, 1997

[30] Foreign Application Priority Data

Jul. 16, 1996 [JP] Japan .................................. 8-185838

[51] Int. Cl.⁶ .................................................. H01L 21/322
[52] U.S. Cl. ...................... 438/471; 438/162; 438/143; 438/473; 438/476; 438/402; 257/629; 257/635
[58] Field of Search .................................. 438/162, 143, 438/471, 473, 474, 476, 402; 257/629, 635, 636, 637, 640, 646

[56] References Cited

U.S. PATENT DOCUMENTS

| | | | |
|---|---|---|---|
| 5,138,421 | 8/1992 | Saito .................................. | 257/526 |
| 5,244,819 | 9/1993 | Yue ..................................... | 438/402 |
| 5,441,899 | 8/1995 | Nakai et al. ......................... | 438/766 |
| 5,616,507 | 4/1997 | Nakai et al. ......................... | 438/480 |
| 5,721,145 | 2/1998 | Kusakabe et al. ................... | 438/476 |
| 5,773,152 | 6/1998 | Okonogi .............................. | 428/446 |

FOREIGN PATENT DOCUMENTS

| | | |
|---|---|---|
| 60-176241 | 9/1985 | Japan . |
| 1-235242 | 9/1989 | Japan . |
| 4-53140 | 2/1992 | Japan . |
| 4-171827 | 6/1992 | Japan . |

OTHER PUBLICATIONS

K. Watanabe et al., "Possible causes of trace metallic contaminants in SIMOX and BESOI substrates", pp. 95–96, IEEE International SOI Conference, Oct. 1994.

J. Stoemenos et al., "Mechanisms of SIMOX synthesis and related microstructural properties", pp. 16–27, NEC ULSI, 1997.

*Primary Examiner*—John F. Niebling
*Assistant Examiner*—Lynne A. Gurley
*Attorney, Agent, or Firm*—Young & Thompson

[57] ABSTRACT

In a method of forming a silicon substrate, a gettering film is formed on a bottom surface of a silicon substrate. An oxygen ion implantation into a top surface of the silicon substrate is carried out at a substrate temperature in the range of 400° C.–700° C. The gettering film is removed from the silicon substrate. The silicon substrate is subjected to a heat treatment at a temperature of not less than 1300° C. for causing a reaction of oxygen and silicon to form a silicon oxide film in the silicon substrate after the gettering film is removed.

19 Claims, 3 Drawing Sheets

METHOD OF REMOVING METALLIC CONTAMINANTS FROM SIMOX SUBSTRATE

BACKGROUND OF THE INVENTION

The present invention relates to a method of removing metallic. contaminants from SIMOX substrate.

In recent years, the requirement for improvements in high speed performances of a semiconductor device has been on the increase, for which purpose has been proposed a technique for isolating a semiconductor substrate by a dielectric layer buried in the semiconductor substrate so as to reduce parasitic capacitance and wiring capacitance. The SIMOX substrate is a separation by implanted oxygen substrate wherein a silicon substrate is separated by an buried oxide layer formed by ion-implantation of oxygen. A conventional method of forming the SIMOX substrate will be described with reference to FIGS. 1A and 1B.

With reference to FIG. 1A, oxygen ions 3 are implanted into a single crystal silicon substrate 1 at a dose in the range of $0.4 \times 10^{18}$ cm$^{-2}$ and at a substrate temperature of around 600° C. thereby forming an oxide implanted layer 4.

With reference to FIG. 1B, the substrate 1 is subjected to a heat treatment at a temperature of not less than 1300° C. for a few hours to cause reaction of oxygen with silicon to form a buried silicon oxide layer 5 in the silicon substrate 1.

Metallic contaminants may be introduced into the SIMOX substrate in the oxygen ion implantation process. A result of analysis of metallic contaminants in the SIMOS substrate was reported by K. Watanabe et al. in IEEE International SOI Conference, Oct. 1994 p. 95. Through dislocation and stacking faults formed in the SIMOS substrate were reported by J. Stoemenos et al. in Proceedings of Sixth International Symposium On SOI Technology and Devices 1994, p, 16. The through dislocation and the stacking faults may cause deterioration of the device performance such as increase in leak current. There have been no reports related to removal of metallic contaminants from the SIMOX substrate.

Heavy metal contaminations to the silicon substrate do normally not exceed a detectable limitation of the already known analyzer. As a method of gettering heavy metals introduced in the device processes, inert gases such as nitrogen or argon are ion-implanted into the silicon substrate. Alternatively, a polycrystal silicon film is formed on a bottom surface of the silicon substrate which is disclosed in Japanese laid-open patent publication No. 1-235242. It is disclosed in Japanese laid-open patent publication No. 4-53140 and 4-17182 that a heat treatment and a formation of a polysilicon film are made.

As described above, the metallic contaminants, the dislocation or stacking faults may cause deterioration in resistance of the oxide film and increase in leak current. In order to obtain high performance and high reliability of the device formed on the SIMOX substrate, it is required to reduce the metallic contaminant concentration of the SIMOX substrate for suppression of the dislocation and the stacking faults. Notwithstanding, in the prior art, there have been no reports of attempts to remove the metallic contaminants from the SIMOX substrate.

If nitrogen or argon is ion-implanted into the SIMOX substrate or the polysilicon film is formed on the bottom surface of the SIMOX substrate, no substantive effect can be obtained. Namely, if nitrogen or argon is ion-implanted into the SIMOX substrate, then during a heat treatment, the heavy metal contaminants can be captured by defects formed in the ion-implantation. If the polysilicon film is formed on the bottom surface of the SIMOX substrate, then the heavy metal contaminants can be captured by crystal grains of polysilicon. Notwithstanding, if the heat treatment has been carried out to repair the crystal defects in the SIMOX substrate or to crystallization of the polysilicon toward crystal perfection, the ability of gettering the heavy metal contaminants is reduced. Normally, if the heat treatment is carried out at a high temperature of not less than 1300° C., the nitrogen or argon ion implantation into the SIMOX substrate or the formation of the polysilicon film on the bottom surface of the SIMOX substrate are no longer effective.

In the above circumstances, it had been required to develop a novel method of forming an SIMOX substrate with reductions in metallic contaminant concentration and in crystal defect density.

SUMMARY OF THE INVENTION

Accordingly, it is an object of the present invention to provide a novel method of forming an SIMOX substrate free from the problems as described above.

It is a further object of the present invention to provide a novel method of forming an SIMOX substrate with a reduced metallic contaminant concentration.

It is a still further object of the present invention to provide a novel method of forming an SIMOX substrate with a reduced crystal defect density It is yet a further object of the present invention to provide a method of removing metallic contaminants from an SIMOX substrate.

The above and other objects, features and advantages of the present invention will be apparent from the following descriptions.

The present invention provides a method of forming a silicon substrate comprising the following steps. A gettering film is formed on a bottom surface of a silicon substrate. An oxygen ion implantation into a top surface of the silicon substrate is carried out at a substrate temperature in the range of 400° C.–700° C. The gettering film is removed from the silicon substrate. The silicon substrate is subjected to a heat treatment at a temperature of not less than 1300° C. for causing a reaction of oxygen and silicon to form a silicon oxide film in the silicon substrate.

It is preferable that the gettering film comprises a polysilicon film, an amorphous silicon film, a silicon oxide film, a silicon nitride film or laminations of any combination thereof.

The present invention also provides a method of forming a silicon substrate comprising the following steps. A gettering film is formed on a bottom surface of a silicon substrate. An oxygen ion implantation into a top surface of the silicon substrate is carried out at a substrate temperature in the range of 400° C.–700° C. The silicon substrate is subjected to a first heat treatment in the range of 500° C.–1000° C. The gettering film is removed from the silicon substrate. The silicon substrate is subjected to a second heat treatment at a temperature of not less than 1300° C. for causing a reaction of oxygen and silicon to form a silicon oxide film in the silicon substrate.

It is preferable that the gettering film comprises a polysilicon film, an amorphous silicon film, a silicon oxide film, a silicon nitride film or laminations of any combination thereof.

The present invention further provides a method of forming a silicon substrate comprising the following steps. A first gettering film is formed on a bottom surface of a silicon substrate. An oxygen ion implantation into a top surface of the silicon substrate is carried out at a substrate temperature in the range of 400° C.–700° C. The silicon substrate is subjected to a first heat treatment in the range of 500° C.–1000° C. The first gettering film is removed from the silicon substrate. A second gettering film is formed at least on the bottom surface of the silicon substrate. The silicon substrate is subjected to a second heat treatment at a temperature of not less than 1300° C. for causing a reaction of oxygen and silicon to form a silicon oxide film in the silicon substrate.

It is preferable that the gettering film comprises a polysilicon film, an amorphous silicon film, a silicon oxide film, a silicon nitride film or laminations of any combination thereof.

It is also preferable that the second gettering film is formed on an entire surface of the silicon substrate.

BRIEF DESCRIPTIONS OF THE DRAWINGS

Preferred embodiments according to the present invention will be described in detail with reference to the accompanying drawings.

PREFERRED EMBODIMENTS

A first embodiment according to the present invention will be described with reference to FIGS. 2A through 2D.

Figure 1A:
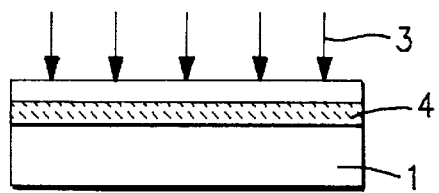
FIGS. 1A and 1B are fragmentary cross sectional elevation views illustrative of SIMOX substrates in sequential steps involved in the conventional forming method.
Figure 1B:
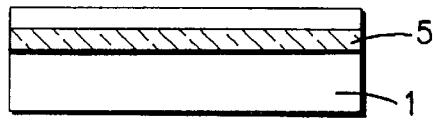
Figure 2A:
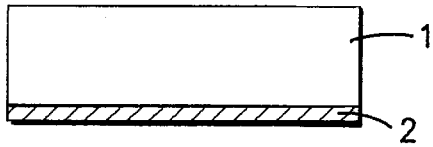
FIGS. 2A through 2D are fragmentary cross sectional elevation views illustrative of SIMOX substrates in sequential steps involved in a novel forming method in a first embodiment according to the present invention.

With reference to FIG. 2A, a polysilicon film 2 having a thickness of 1–2 nanometers is deposited on a bottom surface of a single crystal silicon substrate 1 by a chemical vapor deposition. Considering the gettering effects, small size of crystal grains are preferable, in the light of which the growth temperature is preferably about 600° C.

Alternatively, an amorphous silicon film having a thickness of 1 micrometer may be formed by a low pressure chemical vapor deposition method at a temperature of 550° C. for four hours.

Further alternatively, a silicon nitride film having a thickness of 0.5 micrometers may be formed by a low pressure chemical vapor deposition method or a plasma chemical vapor deposition method using $SiH_2Cl_2$ gas and $NH_4$ gas.

In place of the above gettering film, a silicon oxide film or laminations of those films may be available.

Figure 2B:
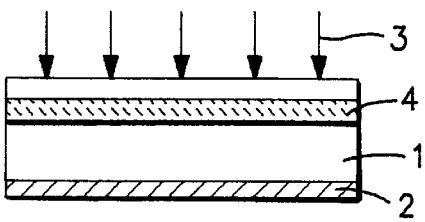

With reference to FIG. 2B, the single crystal silicon substrate 1 is kept at a temperature in the range of 400° C.–700° C. for subsequent implantation of oxygen ions 3 into the surface of the single crystal silicon substrate 1 at a dose of $0.4–1.8\times10^{18}$ to form an oxygen implanted layer 4. When the substrate is kept at such a high temperature, then the metallic contaminants are captured by the polysilicon film 2 formed on the bottom surface of the single crystal silicon substrate 1. If the substrate is kept at a lower temperature of less than 400° C., then it is required to continue the heat treatment for a long time exceeding 10 hours considering the Fe diffusion length. Since the polysilicon film or the silicon nitride film serve as an absorption source for absorbing interstitial silicon generated in the ion-implantation or discharge holes. The absorption of interstitial silicon leads to a reduction in density of stacking faults formed in a post process for formation of a silicon oxide film at a high temperature heat treatment.

Figure 2C:
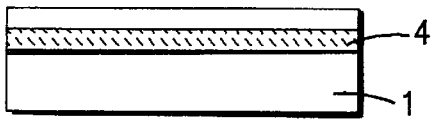

With reference to FIG. 2C, the polysilicon film 2 into which the metallic contaminants and the interstitial silicon have been absorbed is then etched by an etchant of KOH solution. If the silicon nitride film is formed as the gettering film, then the silicon nitride film may be etched by an etchant of $H_3PO_4$ solution.

Figure 2D:
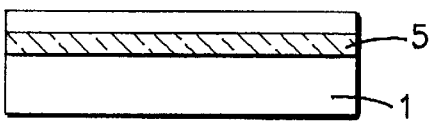

With reference to FIG. 2D, a heat treatment is carried out to the substrate 1 at a temperature of not less than 1300° C., the implanted oxygen atoms are reacted with silicon to thereby form a buried silicon oxide film 5 in the single crystal silicon substrate 1. In the implantation of oxygen ions into the substrate 1, a large mount of interstitial silicon was discharged but have already been absorbed by the gettering film 2 removed. For those reason, generation of the stacking faults is well suppressed. As a result an SIMOX substrate is formed.

Figure 5:
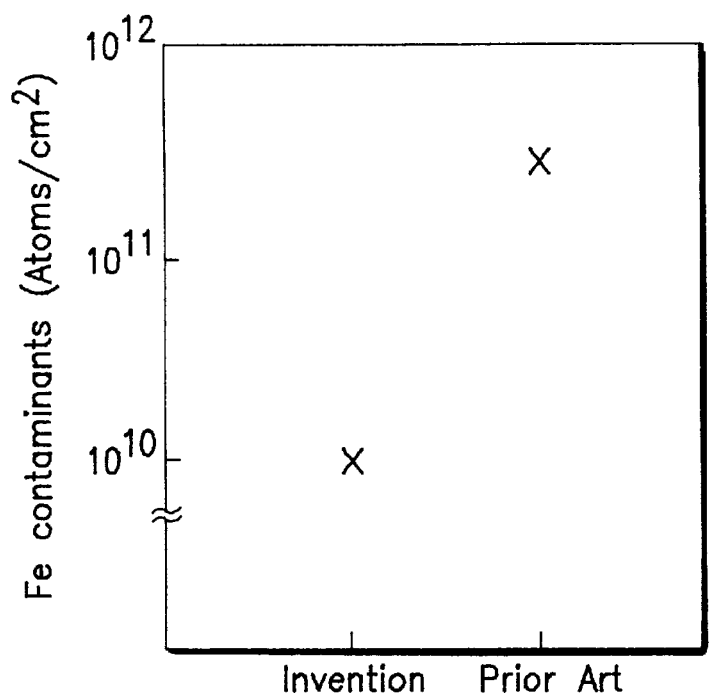
FIG. 5 is a diagram illustrative of difference in Fe contaminant concentration of SIMOX substrates formed in accordance with the present invention and the conventional method.
Figure 6:
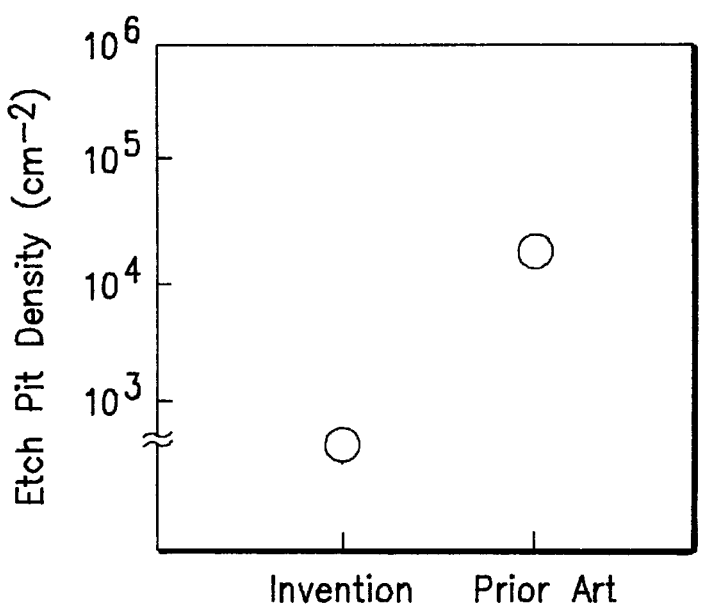
FIG. 6 is a diagram illustrative of difference in etch-pit density of SIMOX substrates formed in accordance with the present invention and the conventional method.

For the SIMOX substrate, Fe contanmin ant concentration and etch-pit density are measured. Fe contaminant concentration is measured by a atomic absorption analysis. FIG. 5 is illustrative of difference in Fe contaminant concentration of SIMOX substrates formed in accordance with the present invention and the conventional method. The SIMOX substrate formed in accordance with the present invention is lower in Fe contaminant concentration by more one order than the SIMOX substrate formed by the conventional method. FIG. 6 is illustrative of difference in etch-pit density in SECCO etching of SIMOX substrates formed in accordance with the present invention and the conventional method. The SIMOX substrate formed in accordance with the present invention is lower in etch-pit density by one order than the SIMOX substrate formed by the conventional method.

A second embodiment according to the present invention will be described with reference to FIGS. 3A through 3D.

Figure 3A:
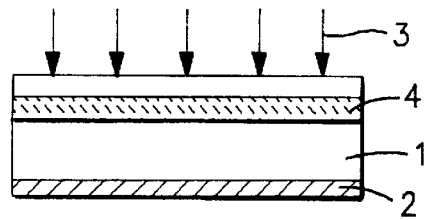
FIGS. 3A through 3D are fragmentary cross sectional elevation views illustrative of SIMOX substrates in sequential steps involved in a novel forming method in a second embodiment according to the present invention.

With reference to FIG. 3A, a polysilicon film 2 having a thickness of 1–2 nanometers is deposited on a bottom surface of a single crystal silicon substrate 1 by a chemical vapor deposition. Considering the gettering effects, small size of crystal grains are preferable, in the light of which the growth temperature is preferably about 600° C.

Alternatively, an amorphous silicon film having a thickness of 1 micrometer may be formed by a low pressure chemical vapor deposition method at a temperature of 550° C. for four hours.

Further alternatively, a silicon nitride film having a thickness of 0.5 micrometers may be formed by a low pressure chemical vapor deposition method or a plasma chemical vapor deposition method using $SiH_2Cl_2$ gas and $NH_4$ gas.

In place of the above gettering film, a silicon oxide film or laminations of those films may be available.

The single crystal silicon substrate 1 is kept at a temperature in the range of 400° C.–700° C. for subsequent implantation of oxygen ions 3 into the surface of the single crystal silicon substrate 1 at a dose of $0.4–1.8 \times 10^{18}$ to form an oxygen implanted layer 4.

Figure 3B:
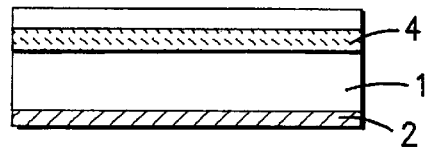

With reference to FIG. 3B, even after the implantation of oxygen ions 3 into the surface of the single crystal silicon substrate 1, the substrate 1 is kept at a high temperature in the range of 500° C.–100° C., so as to allow the metallic contaminants to be thermally diffused from the top surface of the substrate 1 up to the bottom surface thereof so that the metallic contaminants are captured by the polysilicon film 2 formed on the bottom surface of the single crystal silicon substrate 1. If no further heat treatment is carried out, the metallic contaminants introduced in the top surface of the substrate 1 could not be diffused to the bottom surface of the substrate 1 and remain in the substrate 1 and namely not captured by the gettering film. The above further heat treatment may be made in the ion-implantation system but the further heat treatment should be made at a higher temperature than the temperature in the ion-implantation. The metallic contaminants introduced in the ion-implantation process may be precipitated when temperature is dropped to room temperature and solid solubility is also dropped. In order to do gettering process of the precipitated metallic contaminants in solid solution, the temperature is required to be higher than that in the ion-implantation. For example, 500° C.–1000° C. is effective.

Figure 3C:

With reference to FIG. 3C, the polysilicon film 2 into which the metallic contaminants and the interstitial silicon have been absorbed is then etched by an etchant of KOH solution. If the silicon nitride film is formed as the gettering film, then the silicon nitride film may be etched by an etchant of $H_3PO_4$ solution.

Figure 3D:
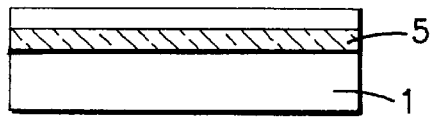

With reference to FIG. 3D, a heat treatment is carried out to the substrate 1 at a temperature of not less than 1300° C., the implanted oxygen atoms are reacted with silicon to thereby form a buried silicon oxide film 5 in the single crystal silicon substrate 1. In the implantation of oxygen ions into the substrate 1, a large mount of interstitial silicon was discharged but have already been absorbed by the gettering film 2 removed. For those reason, generation of the stacking faults is well suppressed. As a result an SIMOX substrate is formed.

A third embodiment according to the present invention will be described with reference to FIGS. 3A through 3D.

Figure 4A:
FIGS. 4A through 4D are fragmentary cross sectional elevation views illustrative of SIMOX substrates in sequential steps involved in a novel forming method in a third embodiment according to the present invention.

With reference to FIG. 4A, a polysilicon film 2 having a thickness of 1–2 nanometers is deposited on a bottom surface of a single crystal silicon substrate 1 by a chemical vapor deposition. Considering the gettering effects, small size of crystal grains are preferable, in the light of which the growth temperature is preferably about 600° C.

Alternatively, an amorphous silicon film having a thickness of 1 micrometer may be formed by a low pressure chemical vapor deposition method at a temperature of 550° C. for four hours.

Further alternatively, a silicon nitride film having a thickness of 0.5 micrometers may be formed by a low pressure chemical vapor deposition method or a plasma chemical vapor deposition method using $SiH_2Cl_2$ gas and $NH_4$ gas.

In place of the above gettering film, a silicon oxide film or laminations of those films may be available.

The single crystal silicon substrate 1 is kept at a temperature in the range of 400° C.–700° C. for subsequent implantation of oxygen ions 3 into the surface of the single crystal silicon substrate 1 at a dose of $0.4–1.8 \times 10^{18}$ to form an oxygen implanted layer 4.

Even after the implantation of oxygen ions 3 into the surface of the single crystal silicon substrate 1, the substrate 1 is kept at a high temperature in the range of 500° C.–1000° C., so as to allow the metallic contaminants to be thermally diffused from the top surface of the substrate 1 up to the bottom surface thereof so that the metallic contaminants are captured by the polysilicon film 2 formed on the bottom surface of the single crystal silicon substrate 1. If no further heat treatment is carried out, the metallic contaminants introduced in the top surface of the substrate 1 could not be diffused to the bottom surface of the substrate 1 and remain in the substrate 1 and namely not captured by the gettering film. The above further heat treatment may be made in the ion-implantation system but the further heat treatment should be made at a higher temperature than the temperature in the ion-implantation. The metallic contaminants introduced in the ion-implantation process may be precipitated when temperature is dropped to room temperature and solid solubility is also dropped. In order to do gettering process of the precipitated metallic contaminants in solid solution, the temperature is required to be higher than that in the ionimplantation. For example, 500° C.–1000° C. is effective.

The polysilicon film 2 into which the metallic contaminants and the interstitial silicon have been absorbed is then etched by an etchant of KOH solution. If the silicon nitride film is formed as the gettering film, then the silicon nitride film may be etched by an etchant of $H_3PO_4$ solution.

Figure 4B:
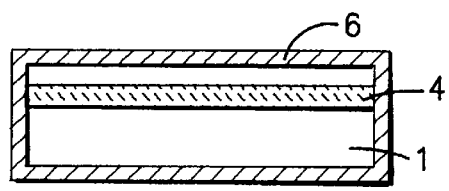

With reference to FIG. 4B, as a secondary gettering film, lamination films 6 are formed on entire surfaces of the substrate 1 or top and bottom surfaces and side walls of the substrate 1. Alternatively, it may be possible that the second gettering film is formed only on the bottom surface of the substrate 1. The lamination films 6 may comprise a silicon oxide film having a thickness of 10 nanometers and a silicon nitride film having a thickness of 100 nanometers.

Figure 4C:
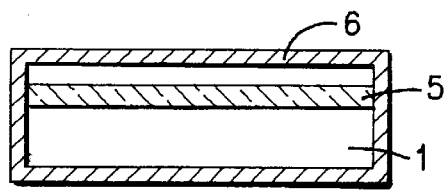

With reference to FIG. 4C, a heat treatment is carried out to the substrate 1 at a temperature of not less than 1300° C., the implanted oxygen atoms are reacted with silicon to thereby form a buried silicon oxide film 5 in the single crystal silicon substrate 1. In the implantation of oxygen ions into the substrate 1, a large mount of interstitial silicon was discharged but have already been absorbed by the gettering film 2 removed. For those reason, generation of the stacking faults is well suppressed.

Figure 4D:

With reference to FIG. 4D, the lamination films 6 are etched by a wet etching. As a result an SIMOX substrate is formed.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims any modifications of the present invention which fall within the spirit and scope of the present invention.

What is claimed is:

1. A method of forming a silicon substrate comprising the steps of forming a gettering film on a bottom surface of a silicon substrate;

carrying out an oxygen ion implantation into a top surface of said silicon substrate at a substrate temperature in the range of 400° C.–700° C. after forming said gettering film;

removing said gettering film from said silicon substrate after said oxygen ion implantation;

subjecting said silicon substrate to a heat treatment at a temperature of not less than 1300° C. for causing a reaction of oxygen and silicon to form a silicon oxide film in said silicon substrate after removing said gettering film.

2. The method as claimed in claim 1, wherein said gettering film comprises a polysilicon film.

3. The method as claimed in claim 1, wherein said gettering film comprises an amorphous silicon film.

4. The method as claimed in claim 1, wherein said gettering film comprises a silicon oxide film.

5. The method as claimed in claim 1, wherein said gettering film comprises a silicon nitride film.

6. The method as claimed in claim 1, wherein said gettering film comprises laminations of any combination of a polysilicon film, an amorphous silicon film, a silicon oxide film and a silicon nitride film.

7. A method of forming a silicon substrate comprising the steps of:

forming a gettering film on a bottom surface of a silicon substrate;

carrying out an oxygen ion implantation into a top surface of said silicon substrate at a substrate temperature in the range of 400°C.–700° C. after forming said gettering film;

subjecting said silicon substrate to a first heat treatment in the range of 500° C.–1000° C. after said oxygen ion implantation;

removing said gettering film from said silicon substrate after said first heat treatment; then subjecting said silicon substrate to a second heat treatment at a temperature of not less than 1300° C. for causing a reaction of oxygen and silicon to form a silicon oxide film in said silicon substrate after removing said gettering film.

8. The method as claimed in claim 7, wherein said gettering film comprises a polysilicon film.

9. The method as claimed in claim 7, wherein said gettering film comprises an amorphous silicon film.

10. The method as claimed in claim 7, wherein said gettering film comprises a silicon oxide film.

11. The method as claimed in claim 7, wherein said gettering film comprises a silicon nitride film.

12. The method as claimed in claim 7, wherein said gettering film comprises laminations of any combination of a polysilicon film, an amorphous silicon film, a silicon oxide film and a silicon nitride film.

13. A method of forming a silicon substrate comprising the steps of:

forming a first gettering film on a bottom surface of a silicon substrate;

carrying out an oxygen ion implantation into a top surface of said silicon substrate at a substrate temperature in the range of 400° C.–700° C. after forming said first gettering film;

subjecting said silicon substrate to a first heat treatment in the range of 500° C.–1000° C. after said oxygen ion implantation;

removing said first gettering film from said silicon substrate after said first heat treatment;

forming a second gettering film at least on said bottom surface of said silicon substrate after removing said first gettering film; then subjecting said silicon substrate to a second heat treatment at a temperature of not less than 1300° C. for causing a reaction of oxygen and silicon to form a silicon oxide film in said silicon substrate after forming said second gettering film.

14. The method as claimed in claim 13, wherein any of said first and second gettering films comprises a polysilicon film.

15. The method as claimed in claim 13, wherein any of said first and second gettering films comprises an amorphous silicon film.

16. The method as claimed in claim 13, wherein any of said first and second gettering films comprises a silicon oxide film.

17. The method as claimed in claim 13, wherein any of said first and second gettering films comprises a silicon nitride film.

18. The method as claimed in claim 13, wherein said second gettering film is formed on an entire surface of said silicon substrate.

19. The method as claimed in claim 13, wherein said gettering film comprises laminations of any combination of a polysilicon film, an amorphous silicon film, a silicon oxide film and a silicon nitride film.

* * * * *